United States Patent [19]

Porterfield

[11] Patent Number: 4,849,718

[45] Date of Patent: Jul. 18, 1989

[54] CIRCUITRY AND METHOD FOR CONTROLLING IMPATT DIODE

[75] Inventor: Donald S. Porterfield, Billerica, Mass.

[73] Assignee: Raytheon Company, Lexington, Mass.

[21] Appl. No.: 257,100

[22] Filed: Sep. 26, 1988

Related U.S. Application Data

[63] Continuation of Ser. No. 92,797, Sep. 3, 1987, abandoned.

[51] Int. Cl.$^4$ .............................................. H03L 1/00
[52] U.S. Cl. ........................................ 331/176; 331/70
[58] Field of Search ...................... 331/70, 117 D, 176

[56] References Cited

U.S. PATENT DOCUMENTS 3,946,336  3/1976  Froom et al. ................... 331/108 R
4,445,096  4/1984  Lee et al. ............................ 331/176

Primary Examiner—Robert L. Griffin
Assistant Examiner—T. Salindong
Attorney, Agent, or Firm—Philip J. McFarland; Richard M. Sharkansky

[57] ABSTRACT

A method of maintaining the operational characteristics of an IMPATT diode is shown to consist of the steps of sensing the peak diode voltage and using such voltage to control the current through the IMPATT diode so that the peak diode voltage is kept constant.

1 Claim, 1 Drawing Sheet

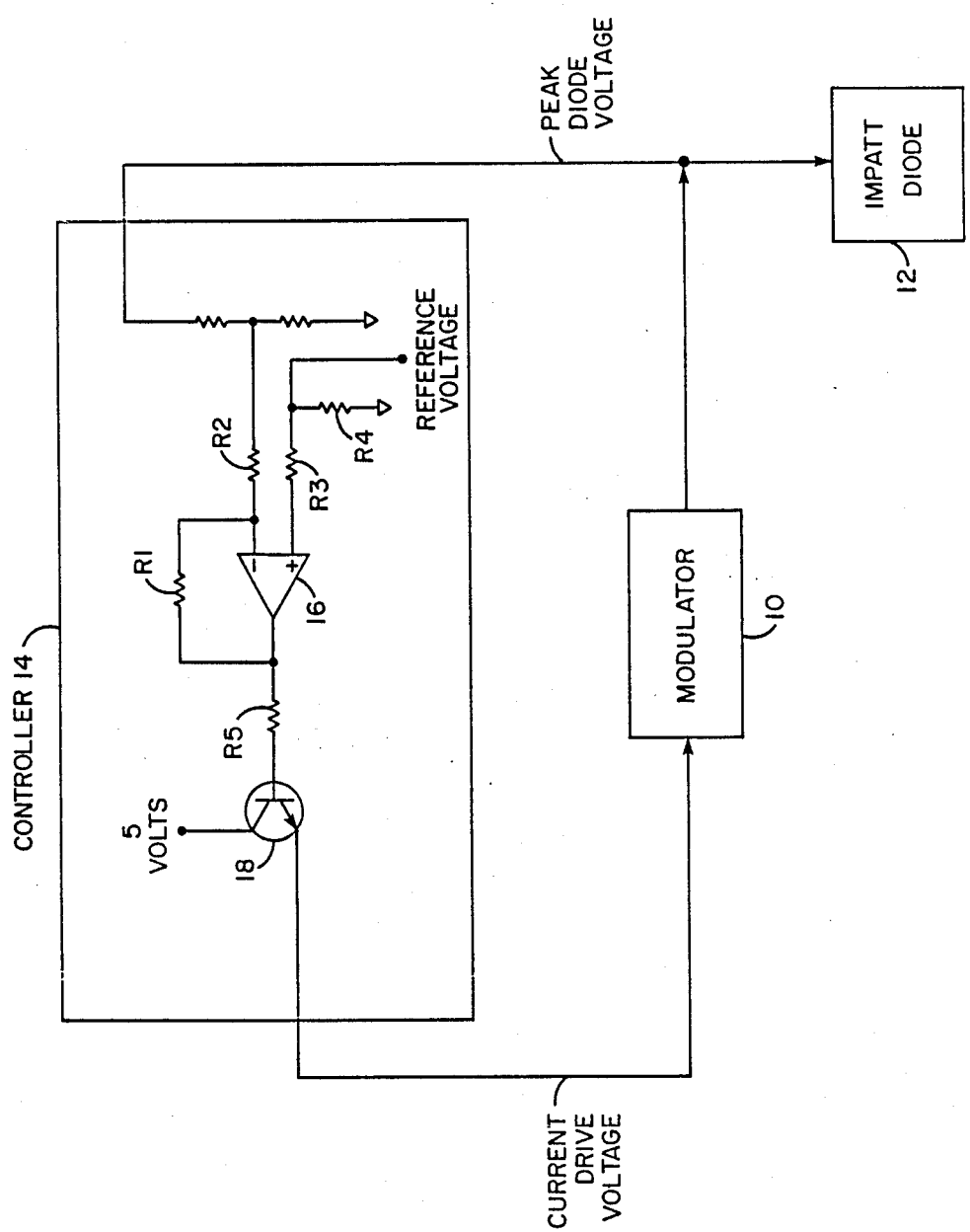

CIRCUITRY AND METHOD FOR CONTROLLING IMPATT DIODE

This application is a continuation of application Ser. No. 092,797 filed Sept. 3, 1987, now abandoned.

BACKGROUND OF THE INVENTION

This invention pertains generally to radio frequency (R.F.) oscillators, and particularly to R.F. oscillators using solid state elements such as IMPATT diodes.

It is known in the art that great care must be taken in the design, construction and operation of R.F. oscillators using IMPATT diodes if desired results are to be attained. In particular, it is necessary that great care be taken to control the operational characteristics of the IMPATT diode (or diodes) used in any R.F. oscillator. Thus, attempts have been made to maintain the temperature of the junction in an IMPATT diode at a constant value regardless of ambient temperature or duty cycle. For example, it is well known to provide a conventional temperature-controlled housing so that changes in ambient temperature are of no moment or to provide (when pulsed operation is desired) a bias current during interpulse intervals that is sufficient to maintain the temperature of the junction at a temperature slightly less than the temperature of the junction during each pulse.

While the just-mentioned techniques are of value in that either, or both, may be used to extend the range of ambient temperatures and duty cycles in which IMPATT diodes may be satisfactorily operated, both techniques require the expenditure of power that does not directly contribute to the production of R.F. oscillations.

Another deficiency of known techniques for controlling an IMPATT diode in an R.F. oscillator derives from the fact that the temperature at the junction of an IMPATT diode ordinarily rises during operation. Thus, in an application such as an active seeker in a guided missile, it is common practice to operate the IMPATT diode at a lower than optimum power level so that the chance of catastrophic failure is reduced to an acceptable level. Obviously, the maximum range for guidance is reduced when the actual power level of the IMPATT diode is lower than optimum.

SUMMARY OF THE INVENTION

With the foregoing background of the invention in mind, it is a primary object of this invention to provide circuitry and method for controlling the temperature at the junction of an IMPATT diode over a wide range of operating conditions.

Another object of this invention is to provide circuitry and method for controlling the temperature at the junction of an IMPATT diode as such temperature tends to rise during operation.

The foregoing and other objects of this invention are generally attained in an R.F. oscillator by: (a) measuring the peak voltage across an IMPATT diode (or across the parallel combination of two more IMPATT diodes); (b) comparing the measured peak voltage with a reference voltage; and (c) changing the bias current to all of the IMPATT diodes in the R.F. oscillator to null the difference between the measured peak voltage and the reference voltage.

BRIEF DESCRIPTION OF THE DRAWING

For a more complete understanding of this invention reference is now made to the following description of a preferred embodiment as shown in the accompanying drawing wherein:

Referring now to the single FIGURE, it may be seen that a conventional modulator 10 (controlled in a manner to be described) provides actuating pulses to an IMPATT diode 12. Suffice it to say here that the peak diode voltage across the IMPATT diode 12 is maintained at a constant value by varying the current through the IMPATT diode 12 to compensate for any change in the temperature of the junction (not shown) in the IMPATT diode 12.

The requisite compensation may be achieved by operation of a controller 14 that is responsive to any small change in the peak diode voltage to change the current through the IMPATT diode to null the change in peak diode voltage. Thus, the IMPATT diode 12 is connected through a voltage divider (made up of two resistors, not numbered) and an isolating resistor R2 to the negative input terminal of an operational amplifier 16. A reference voltage source (not shown) is connected across resistor R4 through an isolating resistor R3 to the positive terminal of the operational amplifier 16. Feedback is provided by a resistor R1 connected between the output terminal of the operational amplifier 16 and the negative input terminal. The output terminal is also connected, through a resistor R5, to the gate electrode of a transistor 18, here an NPN transistor. The collector of the transistor 18 is connected to a voltage source, here with a voltage of 5 volts, and the emitter of the transistor 18 is connected back to the modulator 10. It will now be apparent to one of skill in the art that when the impedance of the IMPATT diode 12 changes by some small increment for whatever reason, the described circuit is effective to change the current through the IMPATT diode 12 to maintain the peak diode voltage at a constant level. It will also be apparent that upon startup (when the impedance of the IMPATT diode 12 is low) the circuit is effective to cause the greatest possible current to be produced by the modulator 10 so that the operating temperature of the junction of IMPATT diode 12 is attained quickly without exceeding the maximum peak diode voltage.

Having described a circuit that may be used to implement the contemplated method it will now be apparent to one of skill in the art that other techniques may be applied without departing from the inventive concept of maintaining the peak diode voltage at a constant level by varying the current through an IMPATT diode to compensate for changing operational conditioning. It is felt, therefore, that this invention should not be restricted to its disclosed embodiment, but rather should be limited only by the spirit and scope of the appended claims.

What is claimed is:

1. A method of thermally stabilizing an IMPATT diode having an impedance varying with temperature to cause such diode to operate at an optimum temperature in response to a signal at a constant voltage level and variable current from a modulator, such method comprising the steps of:

(a) connecting the signal to a parallel combination of the IMPATT diode and a voltage divider that has a substantially constant impedance whereby the current resulting from the signal is divided between the IMPATT diode and the voltage divider in accordance with the impedances thereof;

(b) comparing the voltage developed across a portion of the voltage divider in response to the current therethrough to a reference voltage to produce a control signal indicative of the difference between the optimum temperature of operation and the actual temperature of the IMPATT diode; and (c) applying the control signal to the modulator to change the current out of the modulator until the control signal is nulled.

* * * * *